(12) United States Patent
Li et al.

(10) Patent No.: US 7,973,450 B2
(45) Date of Patent: Jul. 5, 2011

(54) MULTI-DEGREE-OF MICRO-ACTUATOR

(75) Inventors: Ta-Ching Li, LongTang (TW);
Sheng-Chih Shen, Sinying (TW);
Jiun-Cheng Huang, Ji-an Township, Hualien County (TW)

(73) Assignee: Chung-Shan Institute of Science and Technology Armaments Bureau, Ministry of National Defense, Taoyuan County (TW)

( * ) Notice: Subject to any disclaimer, the term of this patent is extended or adjusted under 35 U.S.C. 154(b) by 141 days.

(21) Appl. No.: 12/486,241

(22) Filed: Jun. 17, 2009

(65) Prior Publication Data

US 2010/0320869 A1 Dec. 23, 2010

(51) Int. Cl.
*H02N 2/12* (2006.01)
(52) U.S. Cl. ............... 310/323.01; 310/323.16
(58) Field of Classification Search .......... 310/323.01–323.21, 366
See application file for complete search history.

(56) References Cited

U.S. PATENT DOCUMENTS

| 5,453,653 | A | * | 9/1995 | Zumeris | 310/323.16 |
| 5,946,127 | A | * | 8/1999 | Nagata | 359/280 |
| 6,078,440 | A | * | 6/2000 | Ueyama | 359/824 |
| 2008/0073999 | A1 | * | 3/2008 | Wischnewskij et al. | 310/323.03 |
| 2008/0238249 | A1 | * | 10/2008 | Takahashi et al. | 310/317 |

* cited by examiner

*Primary Examiner* — Derek J Rosenau

(57) ABSTRACT

The present invention provides a multi-dimensional micro-actuator comprising a stator having a plurality of symmetrically arranged electrode piezoelectric plates, a rotator disposed near the stator, and a plurality of contacting elements. Each of the symmetrically arranged electrode piezoelectric plates comprises a piezoelectric plate, a first electrode, and a second electrode. The first and second electrodes are symmetrically arranged on a first surface of the piezoelectric plate. A second surface of the piezoelectric plate is coupled to the ground. The contacting elements are disposed on the electrode piezoelectric plates for rotation of the rotator.

11 Claims, 12 Drawing Sheets

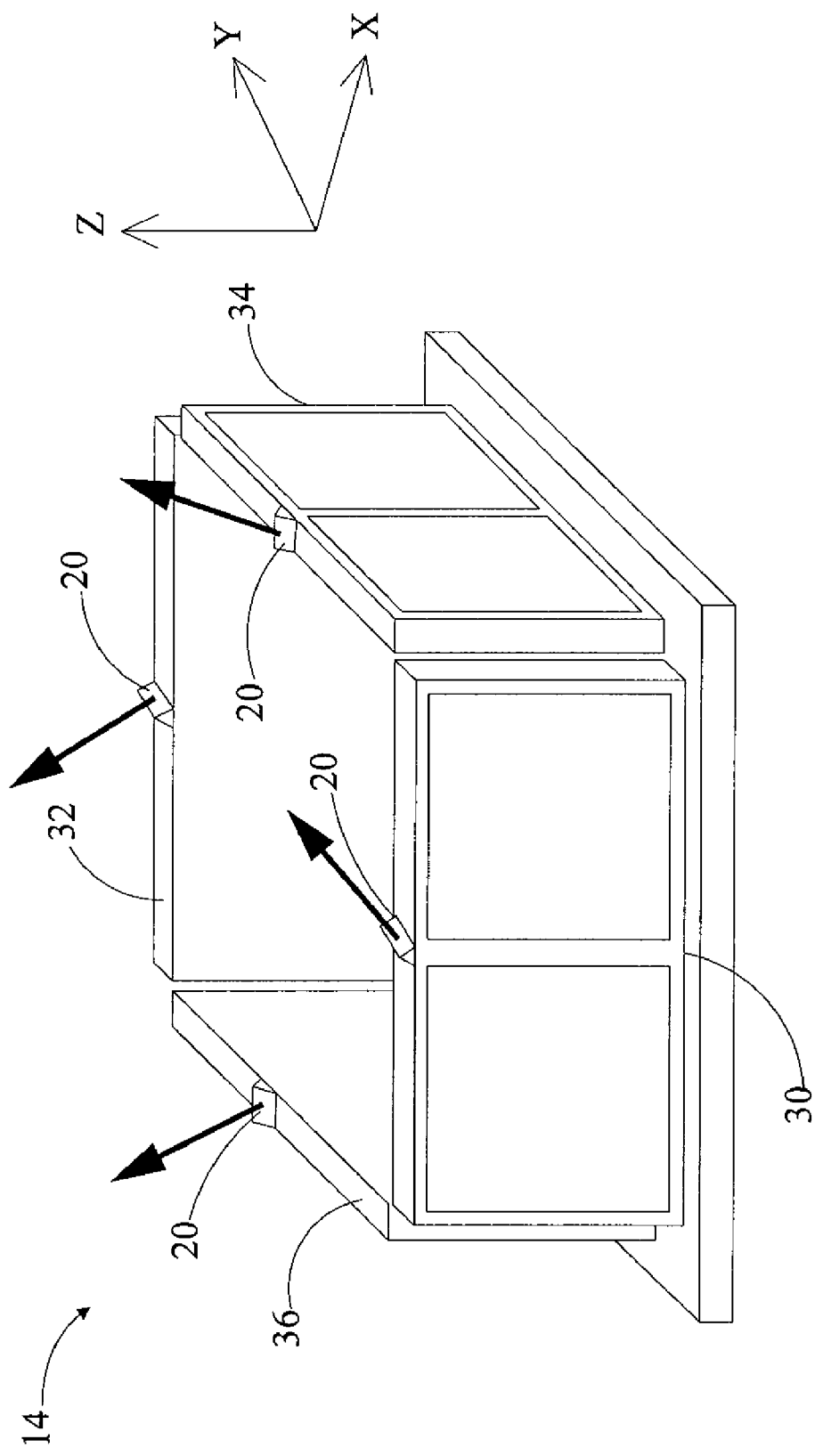

MULTI-DEGREE-OF MICRO-ACTUATOR

BACKGROUND OF THE INVENTION

1. Field of the Invention

The present invention is related to an actuator, and more particularly, to a multi-dimensional micro-actuator.

2. Description of the Prior Art

Recently, due to the fast development of the micro-electronic technologies and heavy market demand, actuators are used in more and more new kinds of electronic devices or systems, such as digital cameras, solar concentrator photovoltaic systems or visual surveillance systems, for positioning or tacking toward a desired direction. There are many different kinds of actuator and one example is the multi-axis electro-magnetic motor. The multi-axis electromagnetic motor includes multiple single-axis motors co-operating through gears, which results in a large volume and heaviness of the motor. The application of the multi-axis electro-magnetic motor is therefore limited and can not be used in light and handy devices and systems.

Another example is the multi-degree-of-freedom ultrasonic motor. Although it has more degrees of freedom and higher efficiency, its stator structure and driving mechanism are complicated, and the large volume of the stator (larger than the rotator) makes it impossible to actuate a rotator bigger than the stator. Further, the multi-degree-of-freedom ultrasonic motor exhibits a high power consumption due to a high driving voltage. These drawbacks also limit its application.

Therefore, the present invention provides a high-precision multi-dimensional micro-actuator which is simple, small and light, uses a low driving voltage, and has low power consumption.

SUMMARY OF THE INVENTION

The present invention provides a multi-dimensional micro-actuator having multiple symmetrically arranged electrode piezoelectric plates which moves in different directions to rotate the rotator along multiple axes. Thus, a multi-axis rotation for precise positioning is achieved.

The present invention also provides a multi-dimensional micro-actuator with simple, small and light structure for microminiaturization.

The present invention further provides a multi-dimensional micro-actuator using a low driving voltage for rotation of the rotator, which decreases the power consumption.

The multi-dimensional micro-actuator according to the present invention comprises a stator having a plurality of symmetrically arranged electrode piezoelectric plates, each comprising a piezoelectric plate, a first and second electrodes, wherein the first and second electrodes are symmetrically arranged on a first surface of the piezoelectric plate, and a second surface of the piezoelectric plate is coupled to the ground, a rotator disposed near the stator, and a plurality of contacting elements, disposed on the electrode piezoelectric plates for rotation of the rotator.

The advantage and spirit of the invention may be understood by the following recitations together with the appended drawings.

BRIEF DESCRIPTION OF THE APPENDED DRAWINGS

FIGS. 5A, 5B and 5C show the stretching of the stator resulting in rotation of the rotator along X, Y and Z axes in the multi-dimensional micro-actuator shown in FIG. 1.

DETAILED DESCRIPTION OF THE INVENTION

Figure 1:
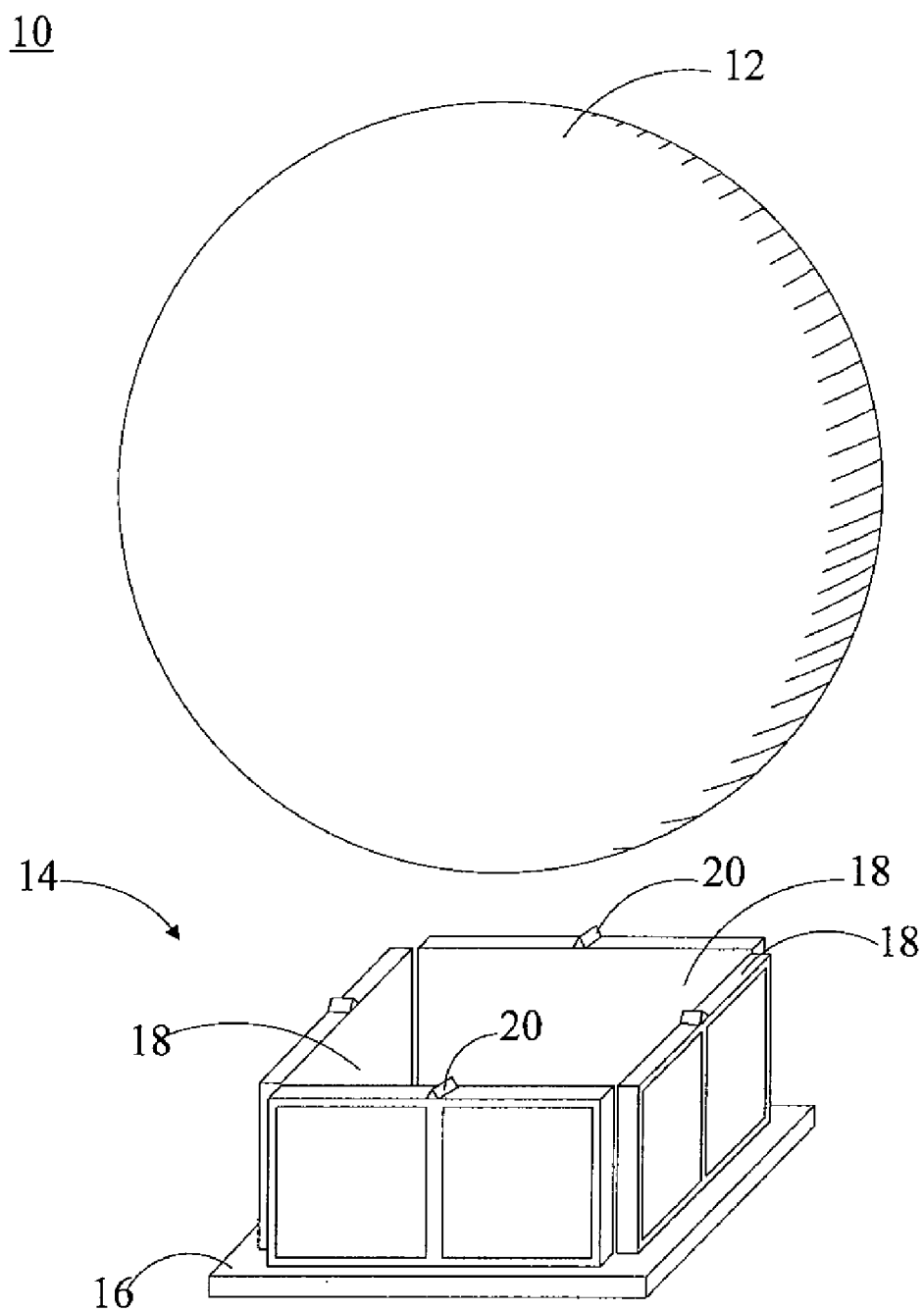
FIG. 1 shows a multi-dimensional micro-actuator according to one embodiment of the present invention.

FIG. 1 shows a multi-dimensional micro-actuator according to one embodiment of the present invention. The multi-dimensional micro-actuator 10 includes a rotator 12 and a stator 14. The stator 14 includes a substrate 16 and multiple electrode piezoelectric plates 18 symmetrically arranged on the substrate 16. In the present embodiment, the electrode piezoelectric plates 18 are arranged perpendicular to each other so that they form a rectangular stator. The electrode piezoelectric plates 18 can be arranged as desired to construct a stator in the form of any polygon, other than a rectangle. The contacting elements 20 are disposed on the center of the long side of the electrode piezoelectric plates 18. In the present embodiment, the contacting elements 20 are in the shape of triangle, but not limited to the shape of triangle. The contacting elements 20 can be in any shape as desired. The rotator 12 is disposed near the stator 14. By applying a driving voltage to the electrode piezoelectric plates 18, the stretching of the plates 18 results in the movements of the contacting elements 20 which rotates the rotator 12. In this way, the electric energy is transformed to mechanic force needed for rotation of the rotator 12. Thus, the multi-dimensional micro-actuator 10 has a simple, small and light structure favorable for microminiaturization.

Figure 2A:
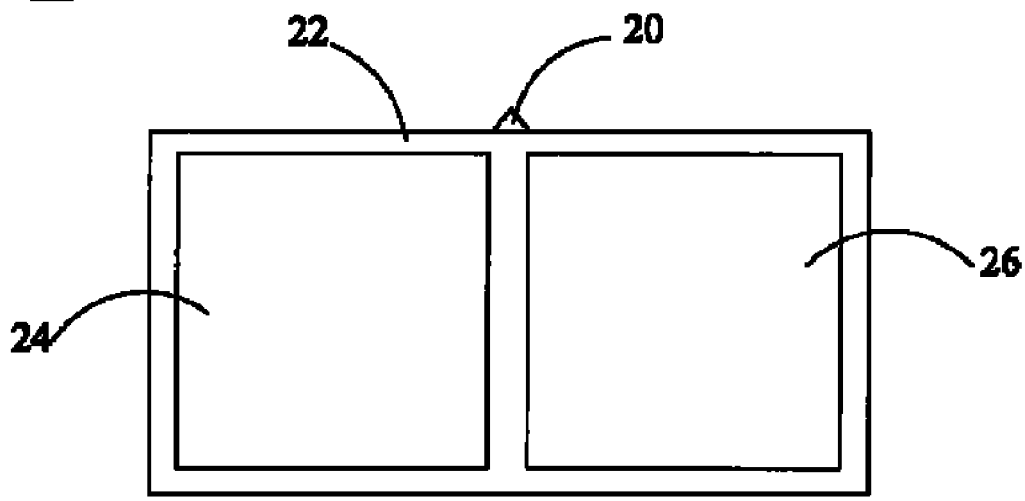
FIGS. 2A and 2B show one of the electrode piezoelectric plates in the multi-dimensional micro-actuator of FIG. 1.
Figure 2B:
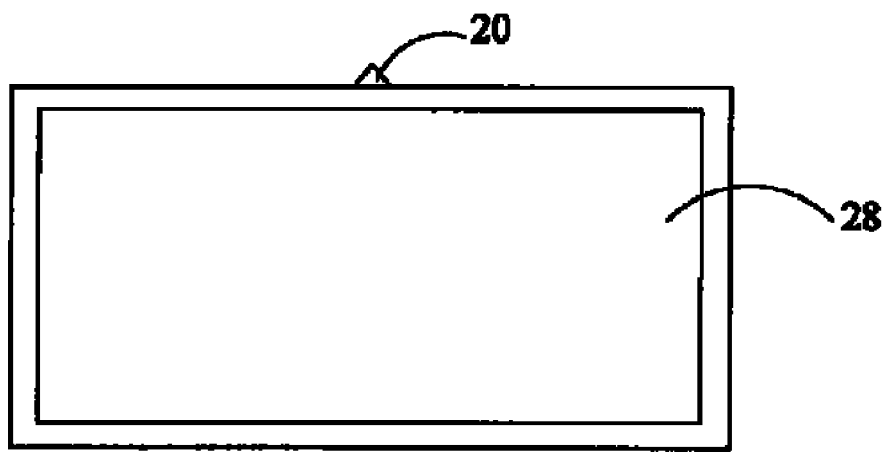

FIGS. 2A and 2B show one of the electrode piezoelectric plates 18 in the multi-dimensional micro-actuator of FIG. 1. The electrode piezoelectric plate 18 includes a piezoelectric plate 22, a first electrode 24 and a second electrode 26. The first and second electrodes 24 and 26 are coupled to a driving voltage source (not shown). The piezoelectric plate 22 is made of, but limited to, piezoelectric ceramics, such as PZT piezoelectric ceramic. The first and second electrodes 24 and 26 are arranged symmetrically on two sides of a first surface of the piezoelectric plate 22. The ground electrode 28 is disposed on a second surface of the piezoelectric plate 22 and coupled to the ground (not shown). The electrodes 24, 26 and 28 may be formed on the plate 22 by electroplating. The preferred length-to-width ratio of the plate 22 ranges from 1.5 to 2.5 and the optimal ratio is 2. The preferred thickness of the plate 22 is equal to or smaller than 1 mm.

Figure 3A:
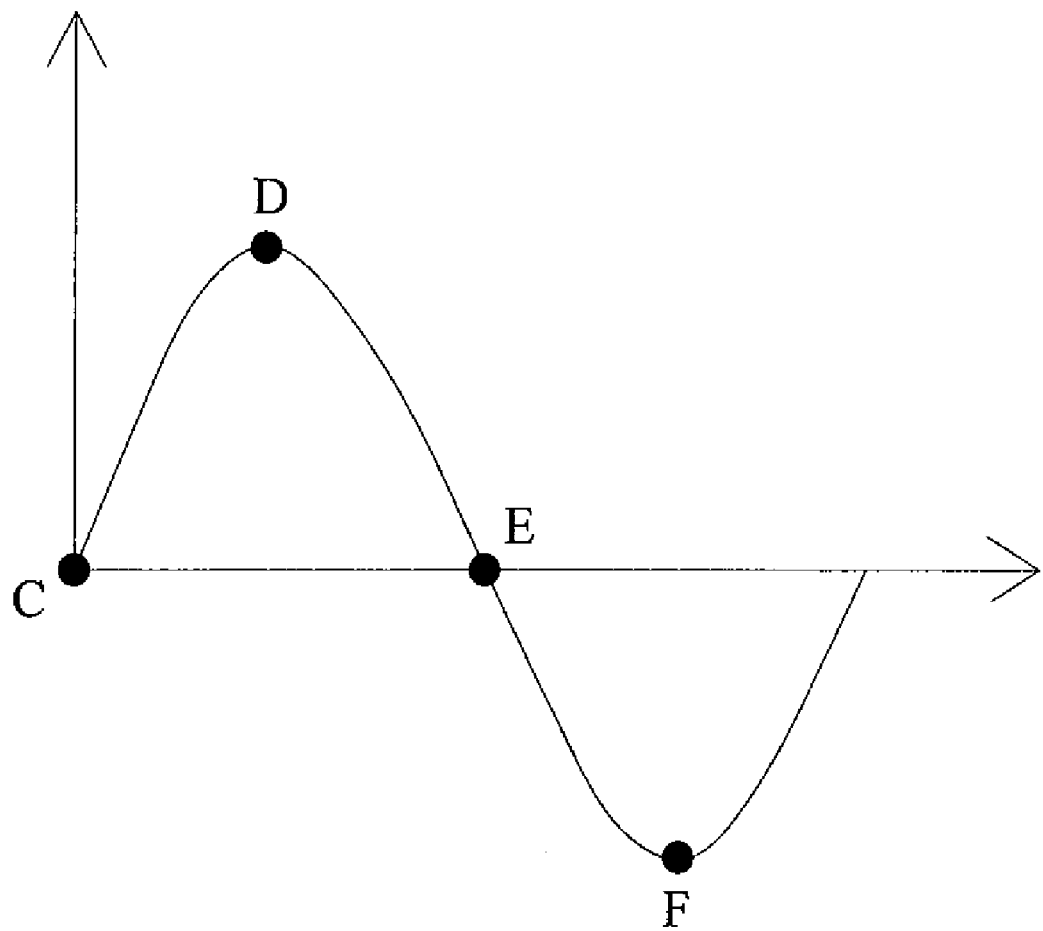
FIGS. 3A and 3B show the waveforms of the driving voltage and stretching of the electrode piezoelectric plate in the multi-dimensional micro-actuator of FIG. 1.
Figure 3B:
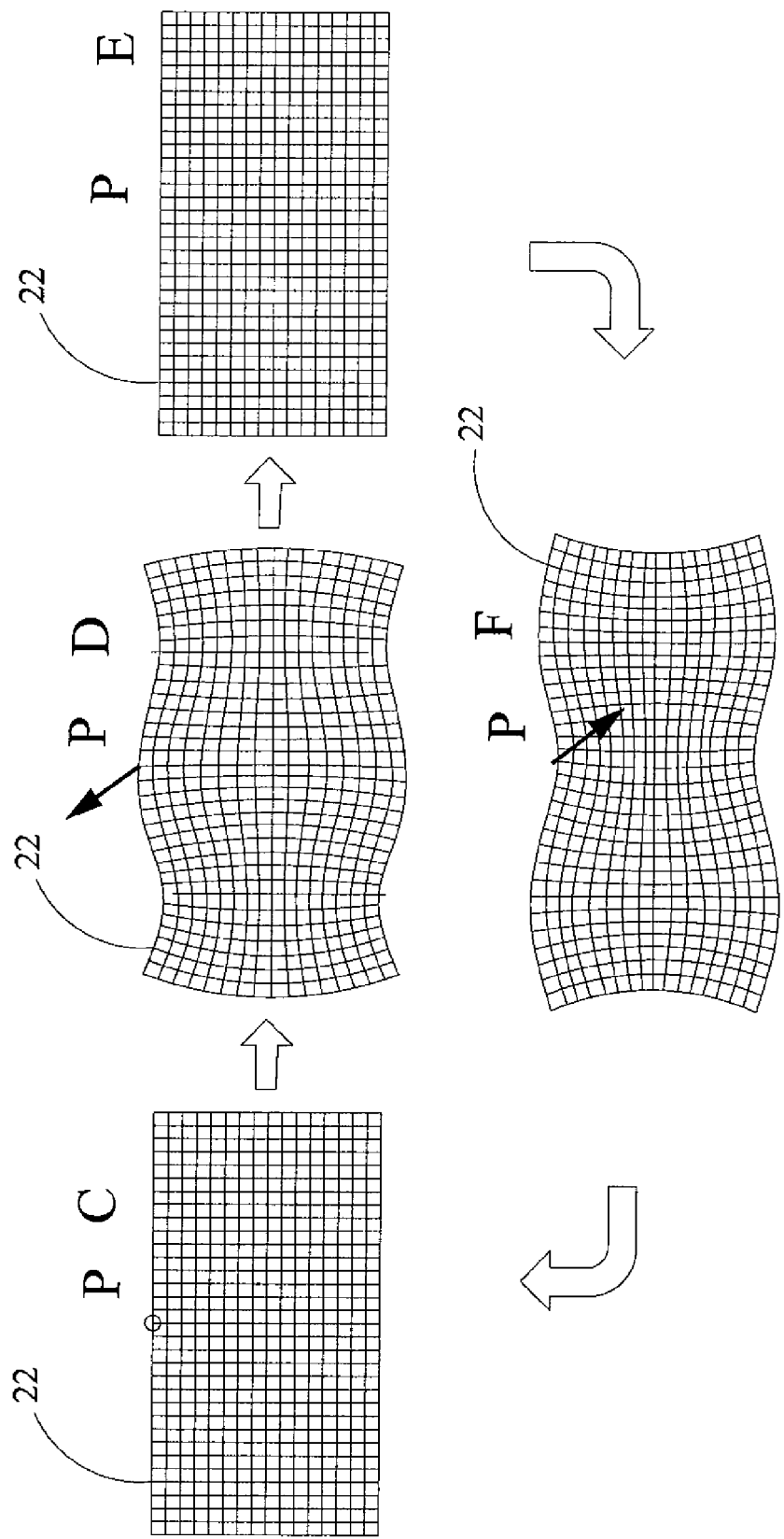

FIGS. 3A and 3B show the waveforms of the driving voltage and stretching of the electrode piezoelectric plate 18. The driving voltage applied to the first or second electrode 24/26 results in the stretching of the plate 22 depending on the characteristics of its material. The plate 22 is polarized along the direction of its thickness. As shown in FIG. 3A, a driving voltage of sine wave is applied to the second electrode 26, the first electrode 24 is kept floating and the ground electrode 28 is coupled to the ground. As shown in FIG. 3B, at time C, the driving voltage results no stretching of the plate 22. At time D, the driving voltage has a level of the positive peak value during the first half period of the sine wave, which results in an up-left movement of the long side of the plate 22 at a point P. At time E, the driving voltage results no stretching of the plate 22. At time F, the driving voltage has a level of the negative peak value during the second half period of the sine wave, which results in a down-right movement of the long side of the plate 22 at the point P.

Figure 4A:
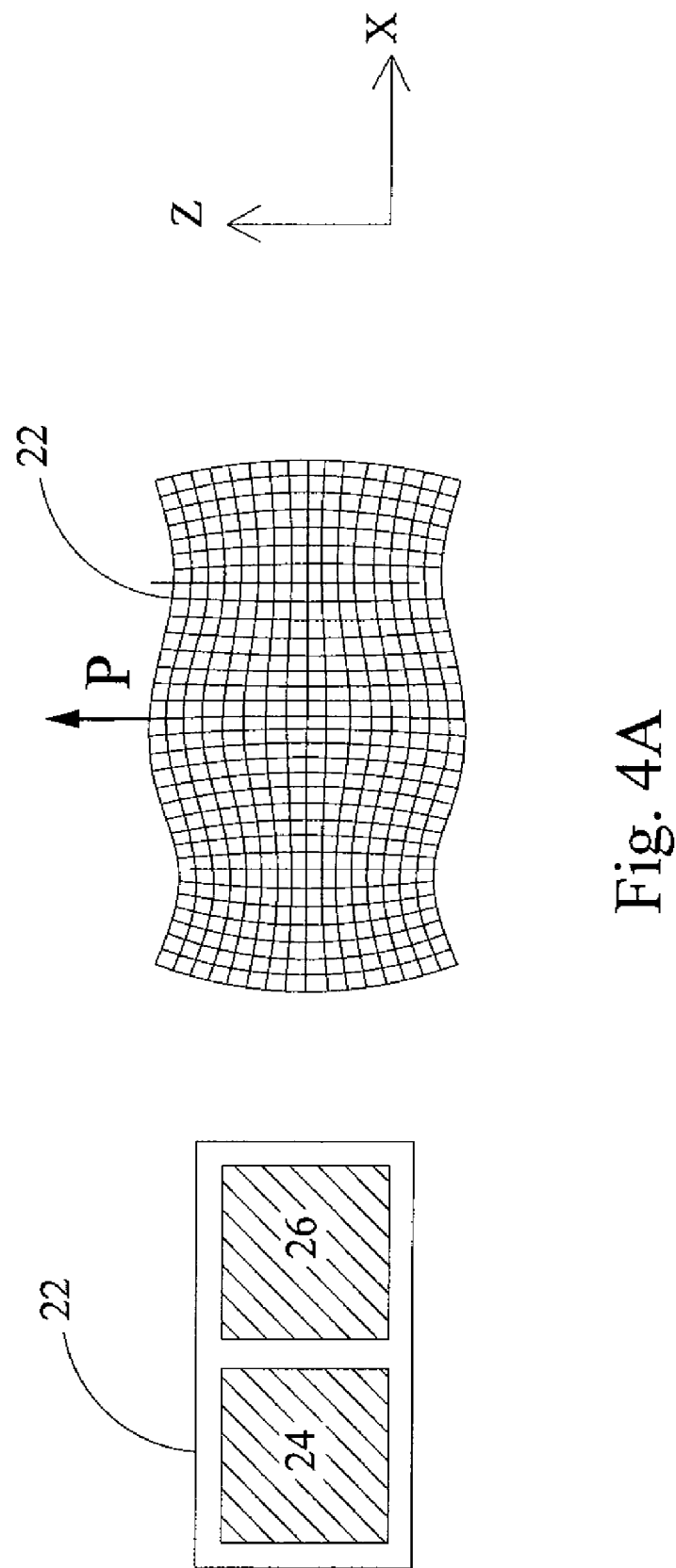
FIGS. 4A, 4B and 4C show the stretching of the electrode piezoelectric plate in three different driving modes used in the multi-dimensional micro-actuator shown in FIG. 1.
Figure 4B:
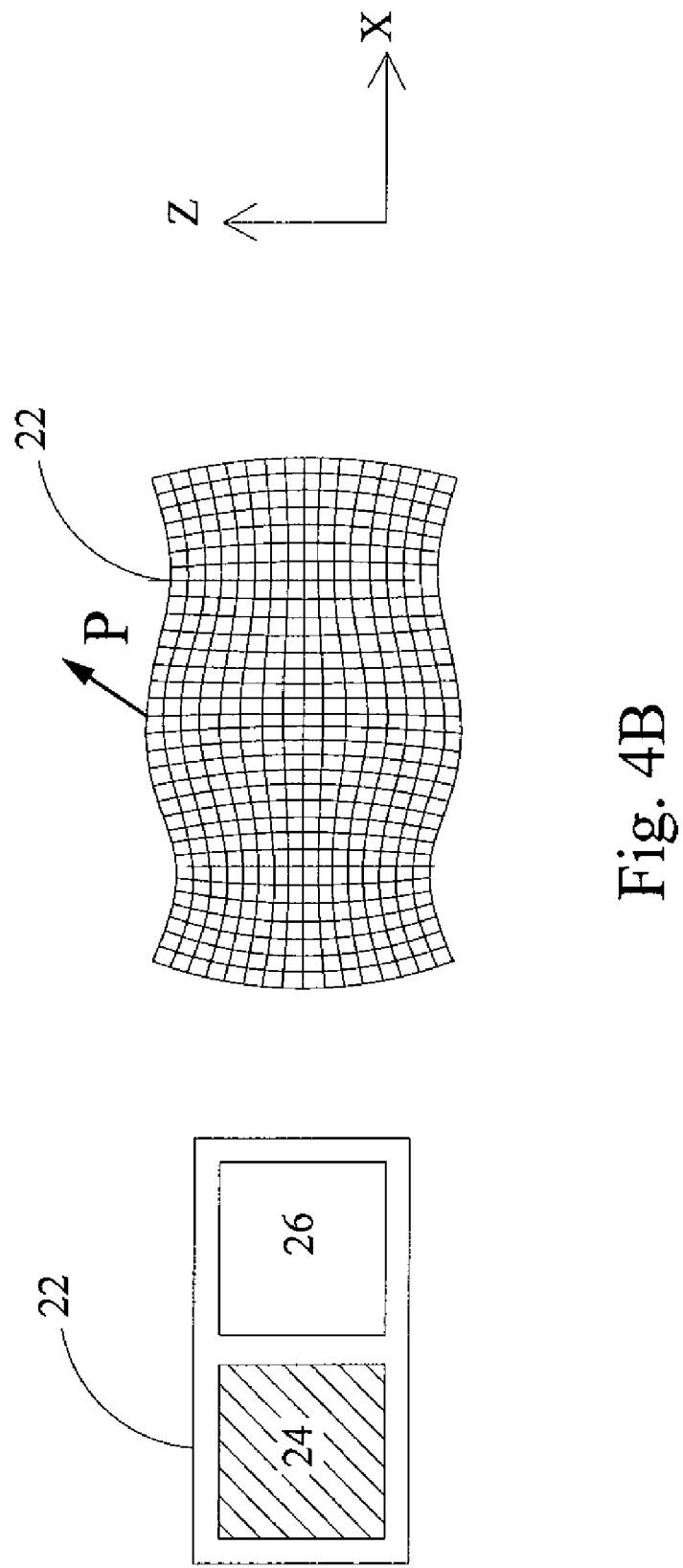
Figure 4C:
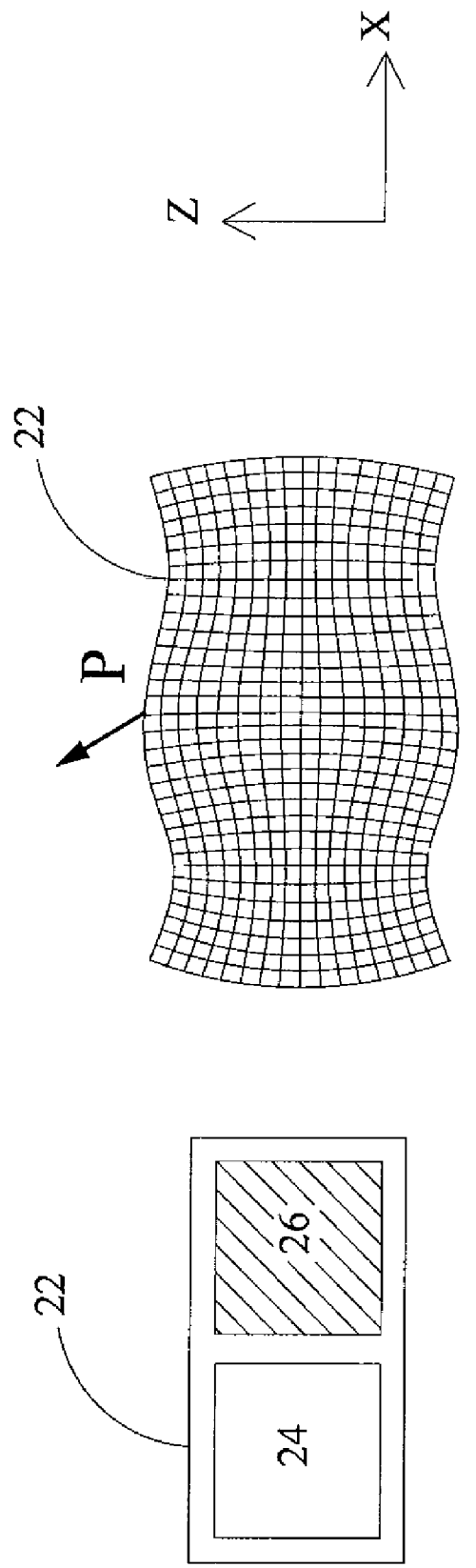

It is noted that the stretching of the plate 22 depends on the level of the driving voltage applied to the first and second electrodes 24 and 26. FIGS. 4A, 4B and 4C show the stretching of the electrode piezoelectric plate in three different driving modes used in the multi-dimensional micro-actuator according to one embodiment of the invention. As shown in FIG. 4A, in Mode 1, the driving voltage is applied to both of the first and second electrodes 24 and 26, which results in the movement of the point P along Z axis. As shown in FIG. 4B, in Mode 2, the driving voltage is applied to the first electrode 24 and the second electrode 26 is kept floating, which results in the up-right movement of the point P. As shown in FIG. 4C, in Mode 3, the driving voltage is applied to the second electrode 26 and the first electrode 24 is kept floating, which results in the up-left movement of the point P.

Figure 5A:
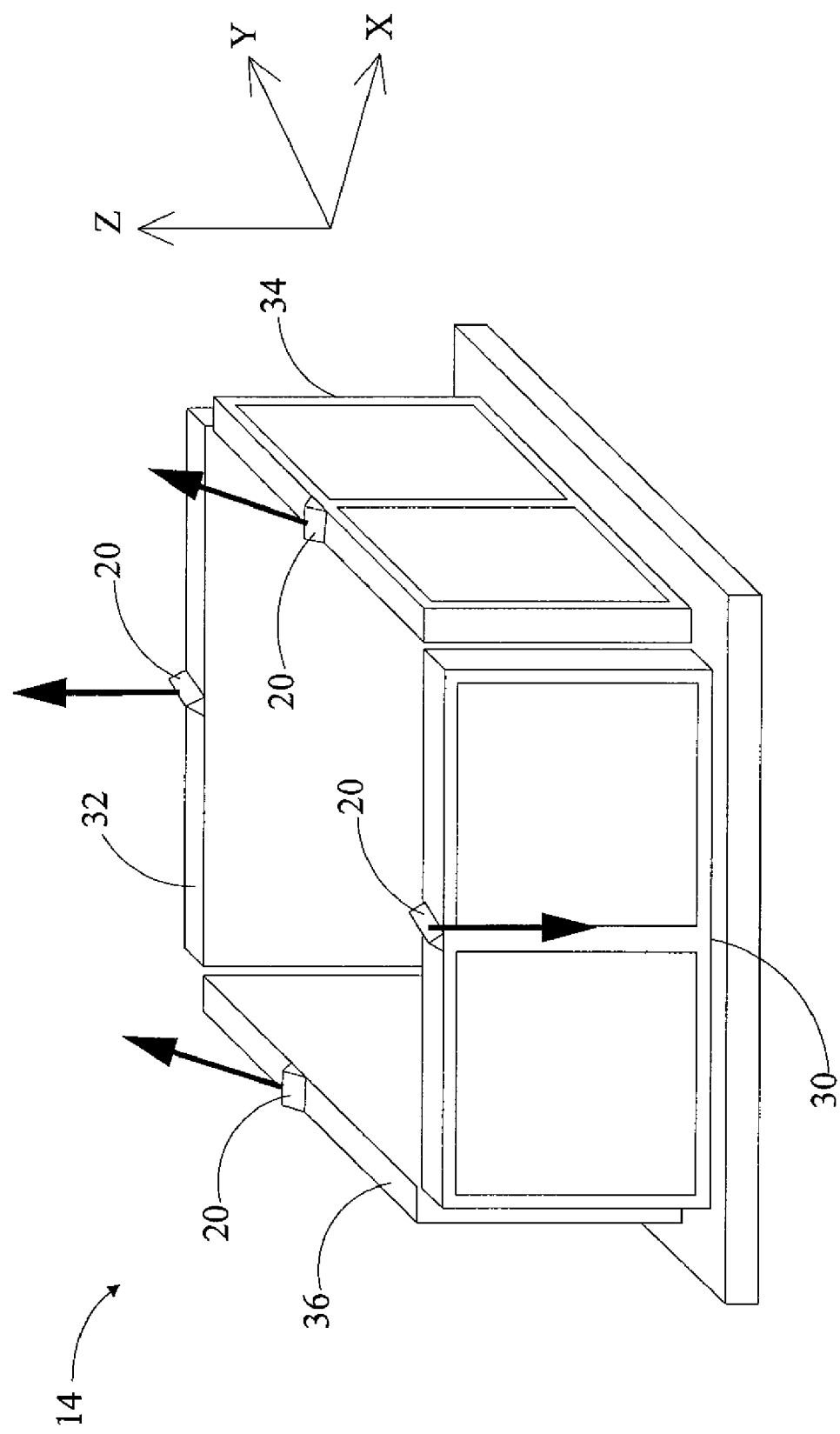
Figure 5B:
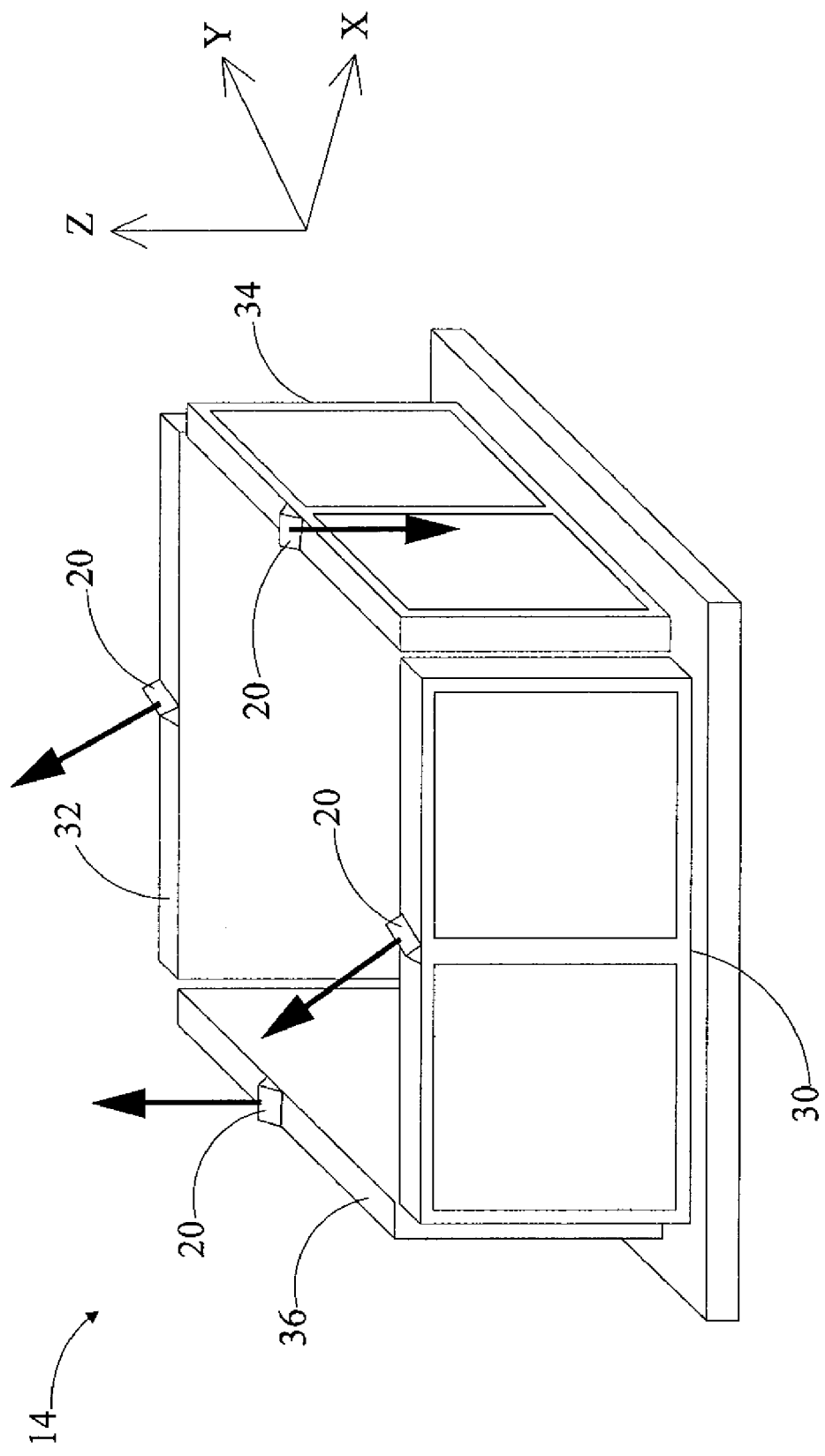

FIGS. 5A, 5B and 5C show the stretching of the stator 14 resulting in rotation of the rotator 12 along X, Y and Z axes in the multi-dimensional micro-actuator according to one embodiment of the invention. The stretching of the stator 14 shown in FIGS. 5A, 5B and 5C respectively corresponds to the Mode 1, 2 and 3 shown in FIGS. 4A, 4B and 4C. The following table indicates the stretching of the plates 30, 32, 34 and 36 of the stator 14 under different modes.

| | Axis | | | | | |
|---|---|---|---|---|---|---|
| | X | | Y | | Z | |
| | Mode | | | | | |
| Plate | Positive | Negative | Positive | Negative | Positive | Negative |
| Plate 30 | Mode 1 ($\pi$) | Mode 1 (0) | Mode 3 (0) | Mode 2 (0) | Mode 2 (0) | Mode 3 (0) |
| Plate 32 | Mode 1 (0) | Mode 1 ($\pi$) | Mode 2 (0) | Mode 3 (0) | Mode 2 (0) | Mode 3 (0) |
| Plate 34 | Mode 2 (0) | Mode 3 (0) | Mode 1 ($\pi$) | Mode 1 (0) | Mode 2 (0) | Mode 3 (0) |
| Plate 36 | Mode 3 (0) | Mode 2 (0) | Mode 1 (0) | Mode 1 ($\pi$) | Mode 2 (0) | Mode 3 (0) |

As shown in the above table, for rotation of the rotator 12 along the positive direction on the X-axis, both of the driving modes of the plates 30 and 32 are Mode 1, and the driving modes of the plates 34 and 36 are respectively Mode 2 and 3. Although the driving mode of the plates 30 and 32 are the same, their driving voltages are out of phase, which results in the movement of their contacting elements in opposite directions. More specifically, the phase of the driving voltage applied to the first and second electrodes on the plate 30 is $\pi$, which is out of phase with that applied to the electrode 24 and 26 shown in FIG. 4A, so that the plate 30 stretches in a direction opposite to that of Mode 1 shown in FIG. 4A. Thus, the contacting element 20 on the plate 30 moves downward, i.e., towards the negative direction on Z-axis, as shown in FIG. 5A.

For rotation of the rotator 12 along the positive direction on the Y-axis, the driving modes of the plates 30 and 32 are respectively Mode 3 and 2, both of the driving modes of the plates 34 and 36 are Mode 1, and the phase of the driving voltage applied to the plate 34 is $\pi$. For rotation of the rotator 12 along the positive direction on the Z-axis, all of the driving modes of the plates 30, 32, 34 and 36 are Mode 2. Further, it is noted from the above table that the rotator 12 may rotate along negative directions on the X, Y and Z-axis. The multi-dimensional micro-actuator according to the present invention is not limited to using the previously described driving modes 1, 2 and 3 for rotation of the rotator. Due to the symmetrical arrangement of the electrodes on the piezoelectric plates, only a low driving voltage is necessary, which decreases the power consumption.

Figure 6:
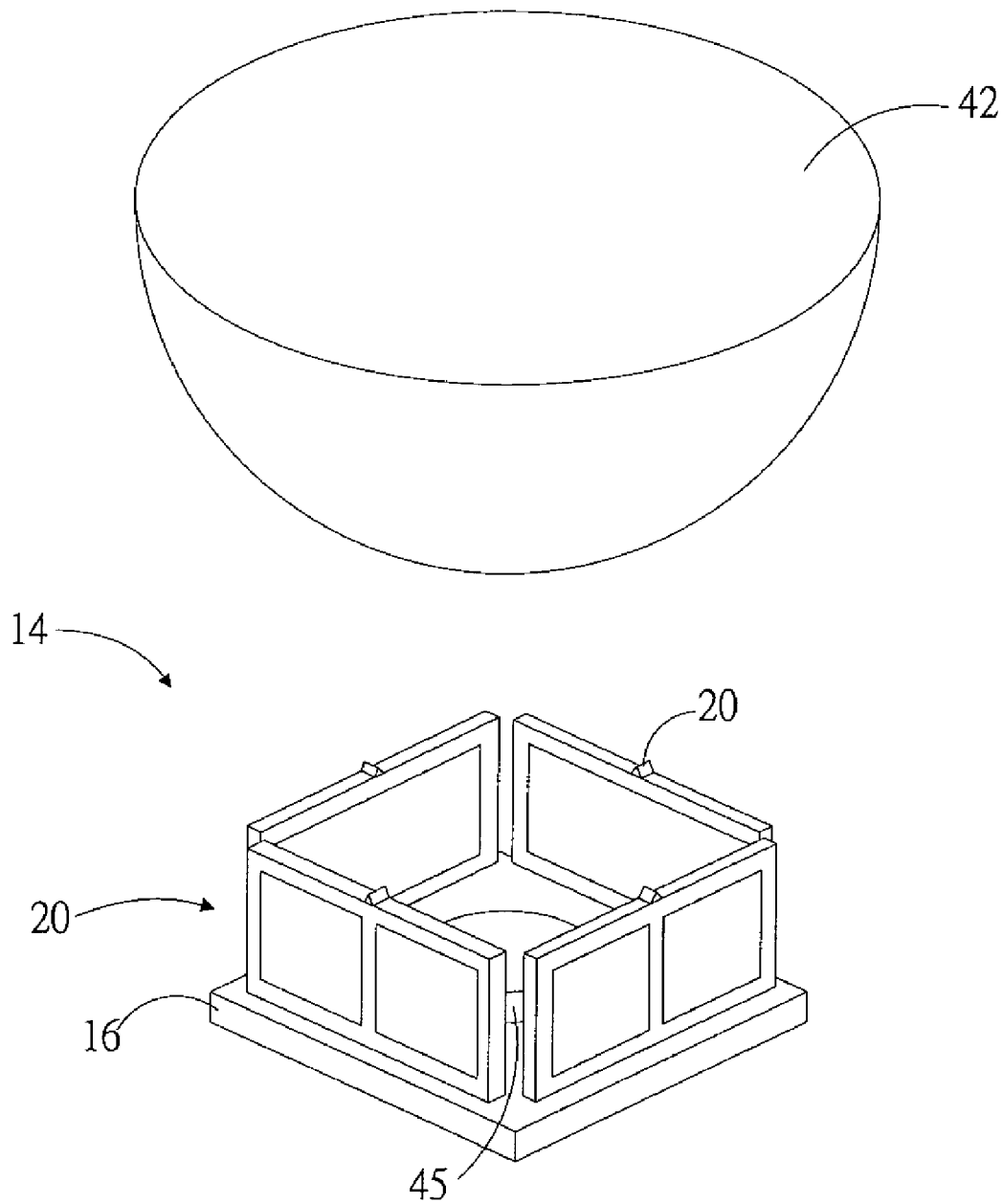
FIG. 6 shows a multi-dimensional micro-actuator according to another embodiment of the invention.

FIG. 6 shows a multi-dimensional micro-actuator according to another embodiment of the invention. The stator 42 of the multi-dimensional micro-actuator 40 is in a form of a hemisphere having an arc surface so that it is suitable for devices such as digital cameras, solar concentrator photovoltaic systems, visual surveillance systems or eyes of a robot. By the stator 14, the rotator 42 can be precisely positioned.

In addition, the multi-dimensional micro-actuator 40 in the present embodiment further includes a magnetic element 45 disposed in the stator 14 and a corresponding element in the rotator 42 made of materials attractable by the magnetic element 45, such as metal. Thus, the contacting elements 20 on the stator 14 can firmly contact with the rotator 42 to facilitate the rotation, prevent undesired displacement of the rotator 14 and precisely position the rotator 14. The magnetic element 45 may be magnet or electromagnet. In an alternate embodiment, the magnetic element 45 may be replaced by a magnetic coating on the surface of the substrate 16 and the surface of the rotator 14 may have a coating made of attractable materials.

Figure 7:
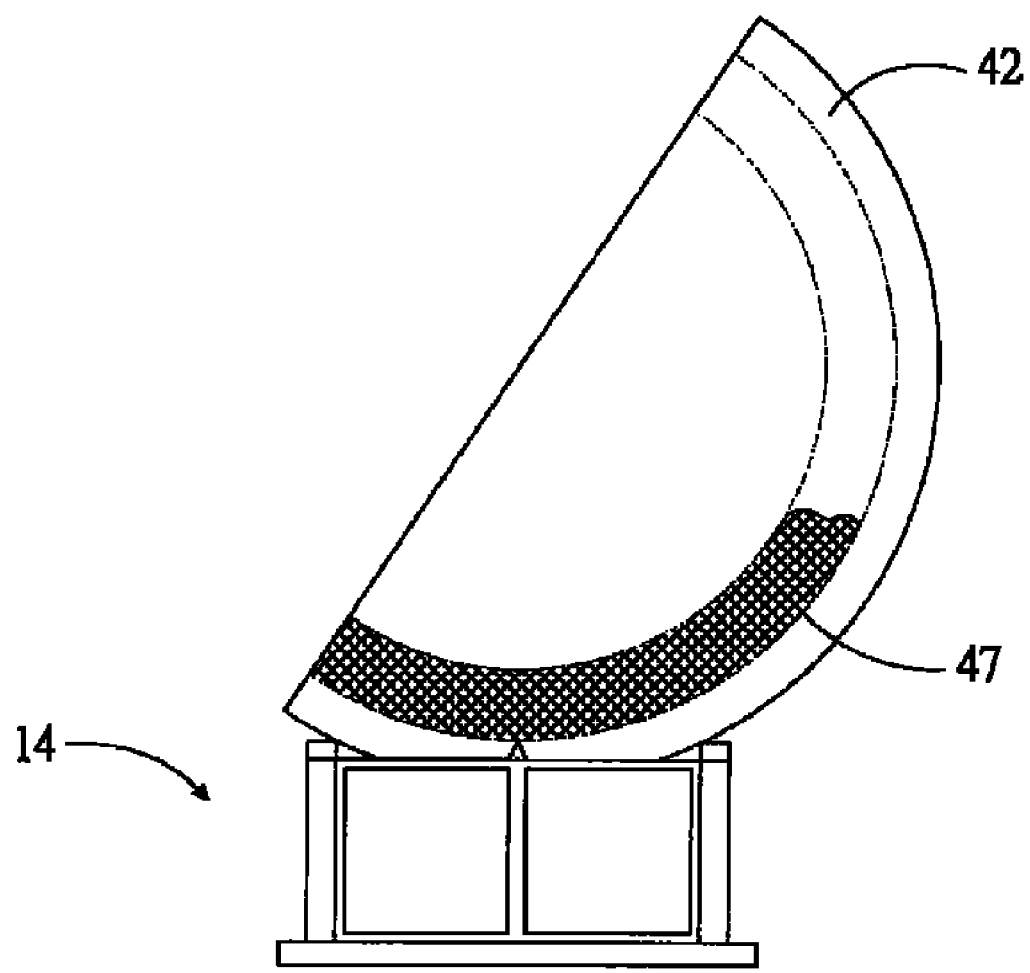
FIG. 7 shows a multi-dimensional micro-actuator according to still another one embodiment of the invention.

FIG. 7 shows a multi-dimensional micro-actuator according to still another one embodiment of the invention. It is noted that the multi-dimensional micro-actuator includes a weighting element 47 disposed in the rotator 42 so that the rotator 14 will fall into the stator 14 when rotating. The weighting element 47 may be movable and may be in the form of liquid, such as water or mercury. The choosing of the liquid depends on the weight of the rotator 42. Thus, the weighting element 47 moves as the rotator 42 rotates, which changes the center of gravity of the rotator 42 and prevent the rotator 42 from falling into the stator 14. In an alternate embodiment, the weighting element 47 may be in the form of solid, such as a steel ball. In an another alternate embodiment, the rotator 14 may be hollow so that the weight of the rotator 14, the level of driving voltage needed for rotation and therefore the power consumption are decreased.

In conclusion, the present invention provides a multi-dimensional micro-actuator comprising a stator having a plurality of symmetrically arranged electrode piezoelectric plates, each comprising a piezoelectric plate, a first and second electrodes, wherein the first and second electrodes are symmetrically arranged on a first surface of the piezoelectric plate, and a second surface of the piezoelectric plate is coupled to the ground, a rotator disposed near the stator, and a plurality of contacting elements, disposed on the electrode piezoelectric plates for rotation of the rotator. Thus, a high-precision multi-axis rotation with low power consumption, and simple, small and light structure for microminiaturization is achieved.

With the example and explanations above, the features and spirits of the invention will be hopefully well described. Those skilled in the art will readily observe that numerous modifications and alterations of the device may be made while retaining the features and spirit of the invention. Accordingly, the above disclosure should be construed as limited only by the metes and bounds of the appended claims.

What is claimed is:

1. A multi-dimensional micro-actuator comprising:
a stator having a plurality of symmetrically arranged piezoelectric plates, each of the symmetrically arranged piezoelectric plates comprising a piezoelectric plate, a first electrode and a second electrode, wherein the first electrode and the second electrode are symmetrically arranged on a first surface of the piezoelectric plate, and a second surface of the piezoelectric plate is coupled to ground;
a rotator disposed near the stator; and
a plurality of contacting elements disposed on the piezoelectric plates for rotation of the rotator, wherein
a surface of the rotator is an arc,
the rotator contains a weighting element, and
the weighting element is movable relative to the rotator.

2. The multi-dimensional micro-actuator as claimed in claim 1, wherein the stator further comprises a substrate on which the piezoelectric plates are disposed.

3. The multi-dimensional micro-actuator as claimed in claim 1, wherein the stator is in the form of a polygon.

4. The multi-dimensional micro-actuator as claimed in claim 1, each of the piezoelectric plates further comprises a ground electrode disposed on the second surface of the piezoelectric plate and coupled to the ground.

5. The multi-dimensional micro-actuator as claimed in claim 1, further comprising a magnetic element disposed in the stator.

6. The multi-dimensional micro-actuator as claimed in claim 5, wherein the magnetic element is a magnet.

7. The multi-dimensional micro-actuator as claimed in claim 5, wherein the magnetic element is an electromagnet.

8. The multi-dimensional micro-actuator as claimed in claim 1, wherein the piezoelectric plate is made of piezoelectric ceramics.

9. The multi-dimensional micro-actuator as claimed in claim 8, wherein the piezoelectric ceramic is PZT piezoelectric ceramic.

10. The multi-dimensional micro-actuator as claimed in claim 1, wherein the length-to-width ratio of the piezoelectric plate ranges from 1.5 to 2.5.

11. The multi-dimensional micro-actuator as claimed in claim 1, wherein the contacting element is disposed at a center of a longger side of the piezoelectric plate.

* * * * *